United States Patent
Ikeda et al.

(10) Patent No.: US 11,527,478 B2
(45) Date of Patent: Dec. 13, 2022

(54) SEMICONDUCTOR DEVICE, SEMICONDUCTOR MEMORY DEVICE, AND SEMICONDUCTOR DEVICE MANUFACTURING METHOD

(71) Applicant: Kioxia Corporation, Tokyo (JP)

(72) Inventors: Mitsuo Ikeda, Yokkaichi (JP); Daisuke Ikeno, Yokkaichi (JP); Akihiro Kajita, Yokkaichi (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 17/121,899

(22) Filed: Dec. 15, 2020

(65) Prior Publication Data
US 2021/0296238 A1    Sep. 23, 2021

(30) Foreign Application Priority Data

Mar. 19, 2020 (JP) .............................. JP2020-049903

(51) Int. Cl.
*H01L 23/535* (2006.01)
*H01L 29/45* (2006.01)
(Continued)

(52) U.S. Cl.
CPC ...... *H01L 23/535* (2013.01); *H01L 21/28518* (2013.01); *H01L 21/76805* (2013.01); *H01L 21/76844* (2013.01); *H01L 21/76865* (2013.01); *H01L 21/76895* (2013.01); *H01L 23/53266* (2013.01); *H01L 29/45* (2013.01)

(58) Field of Classification Search
CPC ............ H01L 23/535; H01L 21/28518; H01L 21/76805; H01L 21/76844; H01L 21/76865; H01L 21/76895; H01L 23/53266; H01L 29/45
See application file for complete search history.

(56) References Cited

U.S. PATENT DOCUMENTS 5,102,826 A    4/1992 Ohshima et al.
5,399,526 A    3/1995 Sumi
(Continued)

FOREIGN PATENT DOCUMENTS

JP    05-090205 A    4/1993
JP    07-027880 B2    3/1995
(Continued)

*Primary Examiner* — Shahed Ahmed
*Assistant Examiner* — Vicki B. Booker
(74) *Attorney, Agent, or Firm* — Oblon, McClelland, Maier & Neustadt, L.L.P.

(57) ABSTRACT

A semiconductor device according to an embodiment includes: a semiconductor substrate; a conductor including tungsten (W) or molybdenum (Mo); a first film provided between the conductor and the semiconductor substrate and including titanium (Ti) and silicon (Si); an insulating layer surrounding the conductor; and a second film provided between the conductor and the insulating layer, surrounding the conductor, and including titanium (Ti) and nitrogen (N). A first distance between the semiconductor substrate and an end portion of the second film on a side opposite to the semiconductor substrate is smaller than a second distance between the semiconductor substrate and an end portion of the conductor on a side opposite to the semiconductor substrate.

15 Claims, 15 Drawing Sheets

(51) Int. Cl.
  *H01L 23/532*   (2006.01)
  *H01L 21/768*   (2006.01)
  *H01L 21/285*   (2006.01)

(56) References Cited

U.S. PATENT DOCUMENTS

| | | | | |
|---|---|---|---|---|
| 5,571,753 | A | * | 11/1996 | Saruwatari ...... H01L 21/823871 |
| | | | | 438/533 |
| 6,013,575 | A | | 1/2000 | Itoh |
| 6,020,259 | A | * | 2/2000 | Chen ................. H01L 21/76876 |
| | | | | 257/E21.583 |
| 6,171,943 | B1 | * | 1/2001 | Doan ................ H01L 21/76855 |
| | | | | 438/584 |
| 2014/0284814 | A1 | * | 9/2014 | Saito ...................... B82Y 10/00 |
| | | | | 977/932 |
| 2014/0353734 | A1 | * | 12/2014 | Xie ................... H01L 21/28088 |
| | | | | 257/288 |
| 2016/0005867 | A1 | * | 1/2016 | Kamineni ............. H01L 29/456 |
| | | | | 257/412 |

FOREIGN PATENT DOCUMENTS

| | | |
|---|---|---|
| JP | 09-022896 A | 1/1997 |
| JP | 3211374 B2 | 9/2001 |
| JP | 3992439 B2 | 10/2007 |
| JP | 2019-083279 A | 5/2019 |

* cited by examiner

CROSS SECTION OF AA'

CROSS SECTION OF BB'

US 11,527,478 B2

SEMICONDUCTOR DEVICE, SEMICONDUCTOR MEMORY DEVICE, AND SEMICONDUCTOR DEVICE MANUFACTURING METHOD

CROSS-REFERENCE TO RELATED APPLICATION

This application is based upon and claims the benefit of priority from Japanese Patent Application No. 2020-049903, filed on Mar. 19, 2020, the entire contents of which are incorporated herein by reference.

FIELD

Embodiments described herein relate generally to a semiconductor device, a semiconductor memory device, and a semiconductor device manufacturing method.

BACKGROUND

In a semiconductor device, for example, in order to electrically connect a semiconductor substrate and a wiring layer provided in an insulating layer on the semiconductor substrate, a contact structure is provided. The contact structure connects the semiconductor substrate and the wiring layer to each other with a conductor provided in a contact hole formed in the insulating layer.

In order to reduce the resistance of the contact structure, for example, the inside of the contact hole is buried with a conductor to form a contact plug. In addition, in order to reduce the resistance of the contact structure, a metal silicide film is formed between the contact plug and the semiconductor substrate.

DETAILED DESCRIPTION

Figure 1:
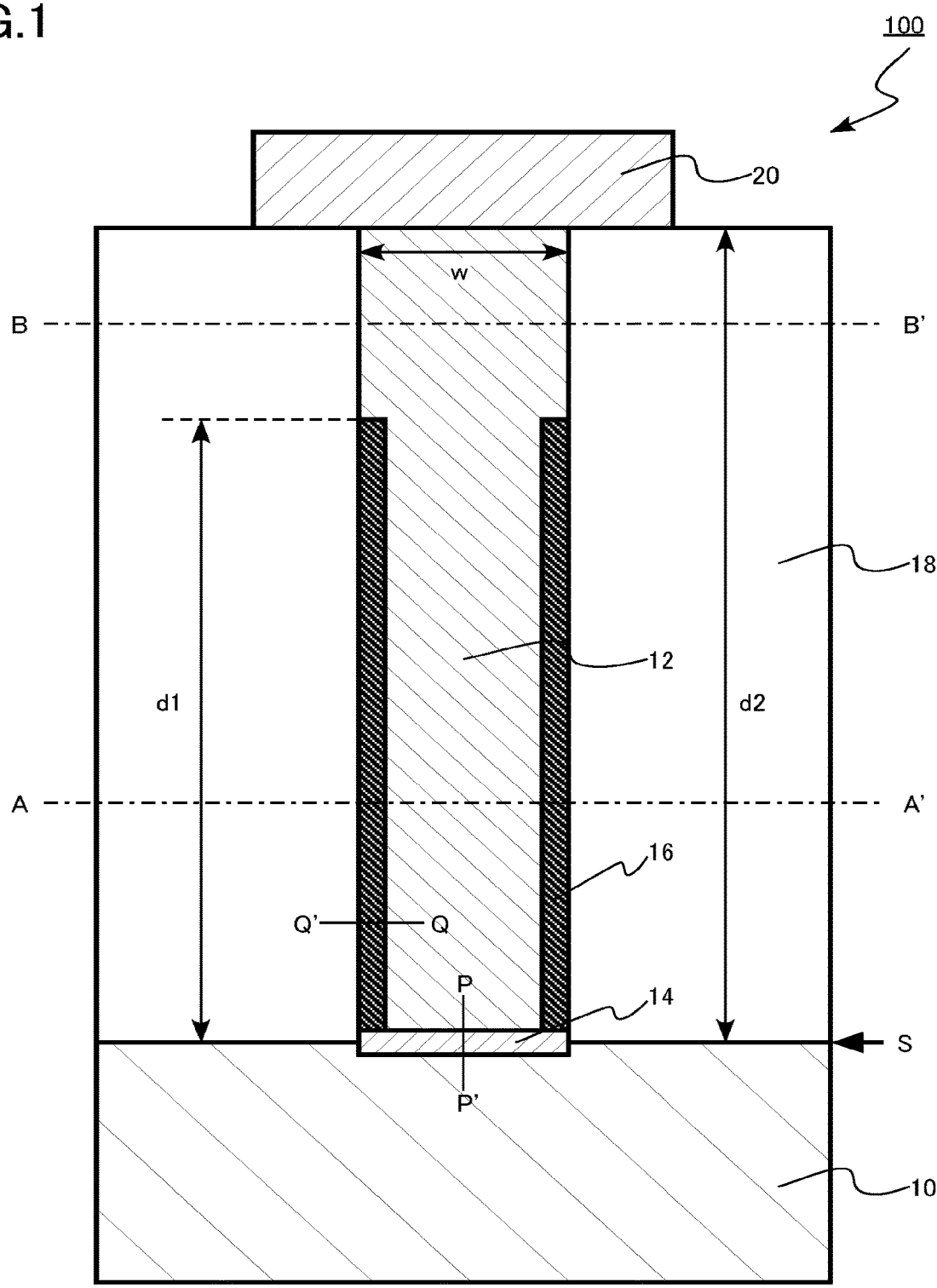
FIG. 1 is a schematic cross-sectional view of a semiconductor device according to a first embodiment.

A semiconductor device according to an embodiment includes: a semiconductor substrate; a conductor including tungsten (W) or molybdenum (Mo); a first film provided between the conductor and the semiconductor substrate, and the first film including titanium (Ti) and silicon (Si); an insulating layer surrounding the conductor; and a second film provided between the conductor and the insulating layer, the second film surrounding the conductor, and the second film including titanium (Ti) and nitrogen (N), wherein a first distance between the semiconductor substrate and an end portion of the second film on a side opposite to the semiconductor substrate is smaller than a second distance between the semiconductor substrate and an end portion of the conductor on a side opposite to the semiconductor substrate.

Hereinafter, embodiments of the present disclosure will be described with reference to the diagrams. In addition, in the following description, the same or similar members and the like are denoted by the same reference numerals, and the description of the members and the like once described will be omitted as appropriate.

In addition, in the present specification, the term "upper" or "lower" may be used for convenience. The term "upper" or "lower" is, for example, a term indicating a relative positional relationship in the diagrams. The term "upper" or "lower" does not necessarily define the positional relationship with respect to gravity.

The qualitative analysis and quantitative analysis of the chemical composition of members forming a semiconductor device or a semiconductor memory device in the present specification can be performed by using, for example, secondary ion mass spectrometry (SIMS) and energy dispersive X-ray spectroscopy (EDX). In addition, in order to measure the thickness of each member forming a semiconductor device or a semiconductor memory device, a distance between members, and the like, for example, a transmission electron microscope (TEM) or a scanning electron microscope (SEM) can be used.

Hereinafter, a semiconductor device and a semiconductor memory device according to an embodiment will be described with reference to the diagrams.

First Embodiment

A semiconductor device according to a first embodiment includes: a semiconductor substrate; a conductor including tungsten (W) or molybdenum (Mo); a first film provided between the conductor and the semiconductor substrate and including titanium (Ti) and silicon (Si); an insulating layer surrounding the conductor; and a second film provided between the conductor and the insulating layer, surrounding the conductor, and including titanium (Ti) and nitrogen (N). A first distance between the semiconductor substrate and an end portion of the second film on a side opposite to the semiconductor substrate is smaller than a second distance between the semiconductor substrate and an end portion of the conductor on a side opposite to the semiconductor substrate.

FIG. 1 is a schematic cross-sectional view of the semiconductor device according to the first embodiment. The semiconductor device according to the first embodiment includes a contact structure 100 illustrated in FIG. 1.

Figure 2A:
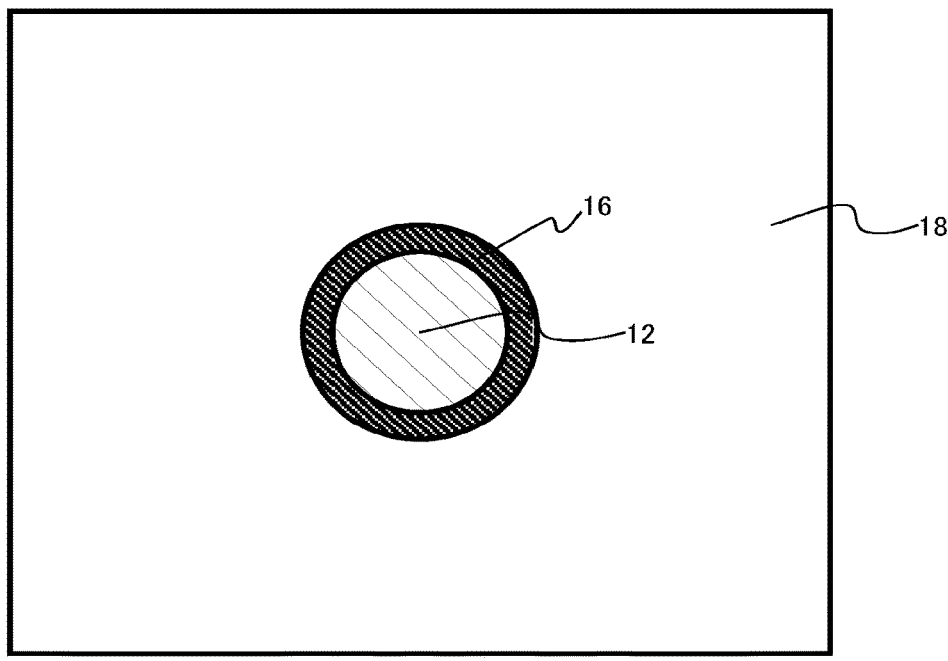
FIGS. 2A and 2B are schematic cross-sectional views of the semiconductor device according to the first embodiment.
Figure 2B:
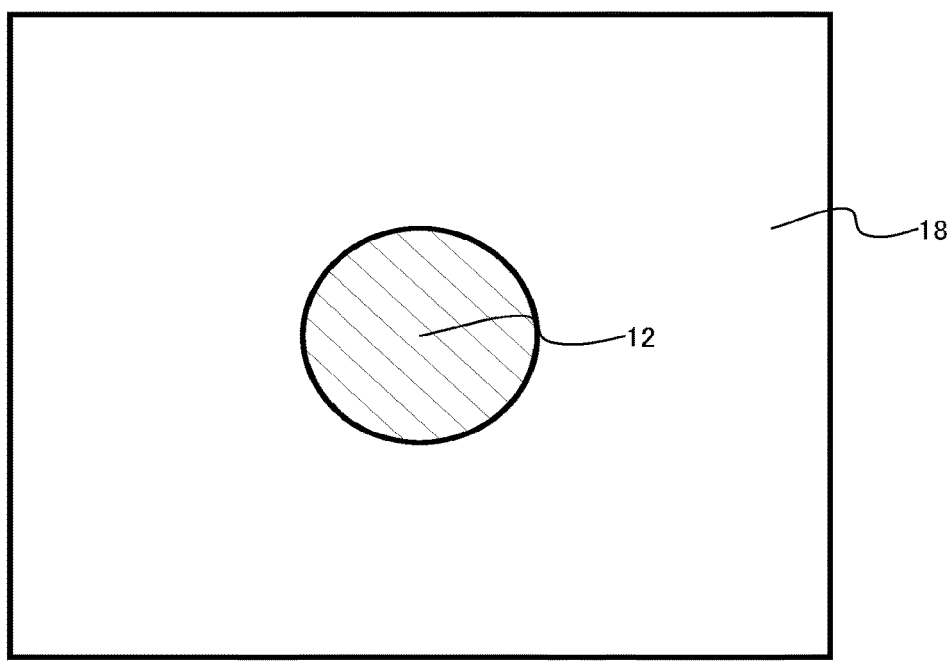

FIGS. 2A and 2B are schematic cross-sectional views of the semiconductor device according to the first embodiment. FIG. 2A is a cross section of AA' in FIG. 1. FIG. 2B is a cross section of BB' in FIG. 1.

The contact structure 100 includes a semiconductor substrate 10, a contact plug 12, a silicide film 14, a sidewall film 16, an insulating layer 18, and a metal wiring 20. The contact plug 12 is an example of the conductor. The silicide film 14 is an example of the first film. The sidewall film 16 is an example of the second film.

The contact structure 100 is a structure for making an electrical conduction between the metal wiring 20 and the semiconductor substrate 10.

The semiconductor substrate 10 is, for example, a single crystal silicon substrate.

The contact plug 12 is provided on the semiconductor substrate 10. The periphery of an upper portion of the contact plug 12 is in contact with the insulating layer 18. A lower portion of the contact plug 12 is surrounded by the sidewall film 16.

The contact plug 12 has a function of reducing the electrical resistance between the metal wiring 20 and the semiconductor substrate 10.

The width (w in FIG. 1) of the contact plug 12 in a direction parallel to the semiconductor substrate 10 is, for example, 40 nm or more and 80 nm or less. A second distance (d2 in FIG. 1) between the semiconductor substrate 10 and an end portion of the contact plug 12 on a side opposite to the semiconductor substrate 10 is, for example, 400 nm or more and 800 nm or less. The ratio (d2/w) of the second distance d2 to the width w, that is, the aspect ratio of the contact plug 12, is, for example, 5 or more and 20 or less.

The contact plug 12 is a conductor. The contact plug 12 includes tungsten (W) or molybdenum (Mo). The contact plug 12 is, for example, tungsten (W) or molybdenum (Mo).

The insulating layer 18 is provided on the semiconductor substrate 10. The insulating layer 18 surrounds the contact plug 12. The contact plug 12 is provided in the insulating layer 18.

The insulating layer 18 is an insulator. The insulating layer 18 includes, for example, silicon oxide, silicon oxynitride, or silicon nitride.

The silicide film 14 is provided between the contact plug 12 and the semiconductor substrate 10. The silicide film 14 is provided on the semiconductor substrate 10. The silicide film 14 is in contact with the semiconductor substrate 10. The contact plug 12 is in contact with the silicide film 14.

The silicide film 14 has a function of reducing the contact resistance between the contact plug 12 and the semiconductor substrate 10.

The thickness of the silicide film 14 is, for example, 3 nm or more and 15 nm or less.

The silicide film 14 includes metal silicide. The silicide film 14 includes, for example, titanium silicide. The silicide film 14 is, for example, a titanium silicide film.

The sidewall film 16 is provided between the contact plug 12 and the insulating layer 18. The sidewall film 16 surrounds the contact plug 12. The sidewall film 16 is in contact with, for example, the contact plug 12 and the insulating layer 18.

The sidewall film 16 is not provided between the upper portion of the contact plug 12 and the insulating layer 18. A first distance (d1 in FIG. 1) between the semiconductor substrate 10 and an end portion of the sidewall film 16 on a side opposite to the semiconductor substrate 10 is smaller than a second distance (d2 in FIG. 1) between the semiconductor substrate 10 and an end portion of the contact plug 12 on a side opposite to the semiconductor substrate 10. The first distance d1 is, for example, 50% or more and 90% or less of the second distance d2.

The sidewall film 16 is spaced apart from the semiconductor substrate 10. The silicide film 14 is disposed between the sidewall film 16 and the semiconductor substrate 10.

The thickness of the sidewall film 16 is, for example, 5 nm or more and 20 nm or less.

The sidewall film 16 is a conductor. The sidewall film 16 includes titanium (Ti) and nitrogen (N). The sidewall film 16 is, for example, titanium nitride. The sidewall film 16 includes, for example, silicon (Si). The sidewall film 16 is, for example, titanium nitride including silicon (Si).

The metal wiring 20 is provided on the contact plug 12. The metal wiring 20 is in contact with the contact plug 12.

The metal wiring 20 includes metal. The metal wiring 20 includes, for example, tungsten (W), copper (Cu), or aluminum (Al).

Across the contact plug 12, the silicide film 14, and the semiconductor substrate 10, a first virtual line segment (PP' in FIG. 1) perpendicular to a surface S of the semiconductor substrate is defined. In addition, across the contact plug 12, the sidewall film 16, and the insulating layer 18, a second virtual line segment (QQ' in FIG. 1) parallel to the surface S of the semiconductor substrate is defined. The nitrogen concentration on the first virtual line segment is lower than the nitrogen concentration on the second virtual line segment. For example, the first maximum value of the nitrogen concentration on the first virtual line segment is lower than the second maximum value of the nitrogen concentration on the second virtual line segment. The first maximum value is, for example, $1/100$ or less of the second maximum value.

Next, an example of a method for manufacturing the semiconductor device according to the first embodiment will be described.

The method for manufacturing the semiconductor device according to the first embodiment includes: forming an insulating layer on a silicon substrate; forming an opening portion reaching the silicon substrate in the insulating layer; forming a first film including titanium (Ti) on the silicon substrate exposed to a bottom portion of an opening portion and on the insulating layer; forming a second film including titanium silicide by making the silicon substrate react with the first film; forming a third film including titanium nitride by nitriding the unreacted first film by heat treatment in an atmosphere including nitrogen; forming a fourth film including titanium (Ti) and nitrogen (N) in the opening portion and on the insulating layer; removing the fourth film at the bottom portion of the opening portion and on an upper side surface of the opening portion; and burying an inside of the opening portion with a fifth film including tungsten (W) or molybdenum (Mo).

FIGS. 3, 4, 5, 6, 7, 8, 9, 10, and 11 are schematic cross-sectional views illustrating a method for manufacturing the semiconductor device according to the first embodiment. FIGS. 3, 4, 5, 6, 7, 8, 9, 10, and 11 illustrate cross sections corresponding to FIG. 1.

Figure 3:
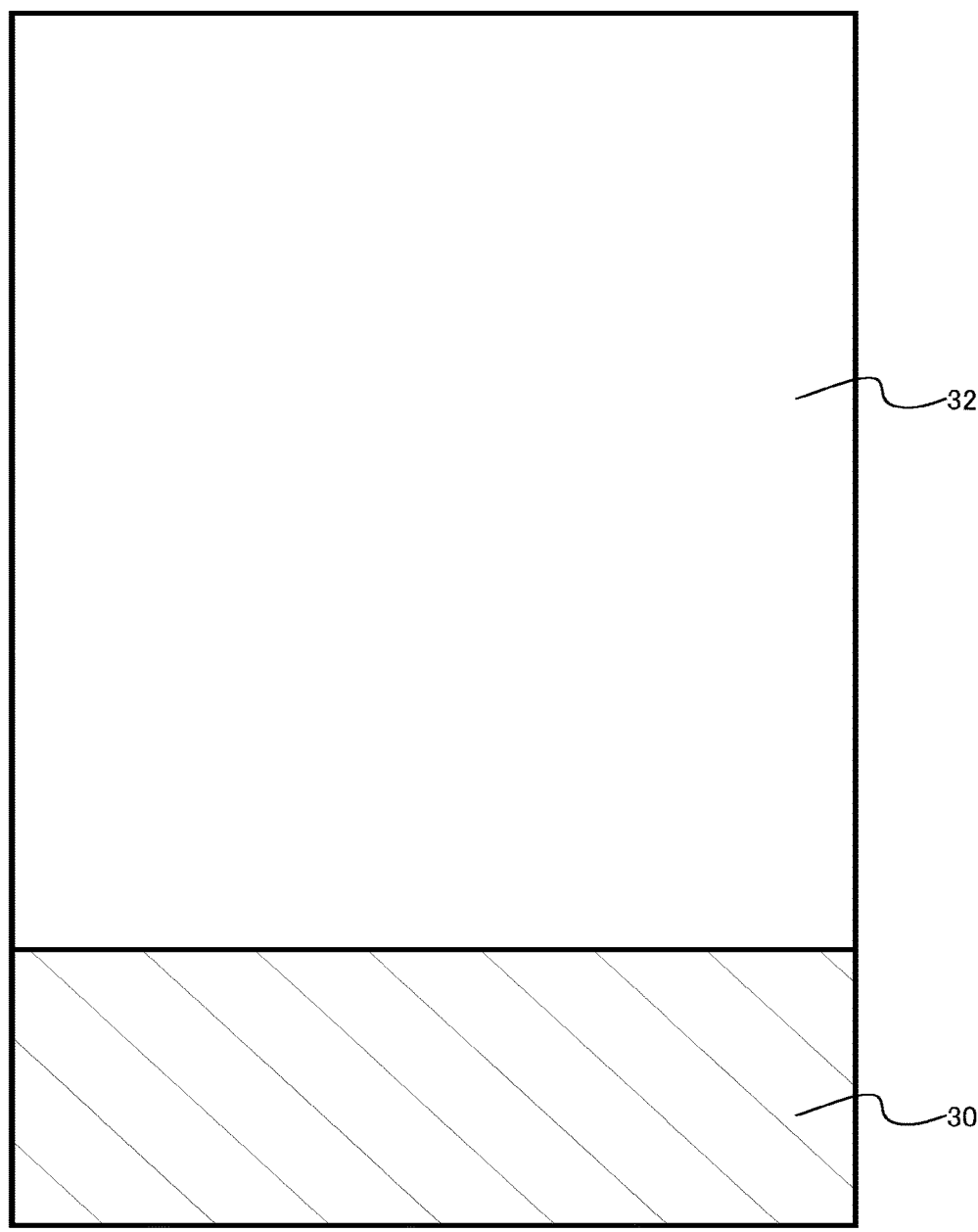
FIG. 3 is a schematic cross-sectional view illustrating a method for manufacturing the semiconductor device according to the first embodiment.

First, a silicon oxide layer 32 is formed on a silicon substrate 30 (FIG. 3). The silicon oxide layer 32 is an example of an insulating layer. The silicon oxide layer 32 is formed using, for example, a thermal chemical vapor deposition method (thermal CVD method).

Figure 4:
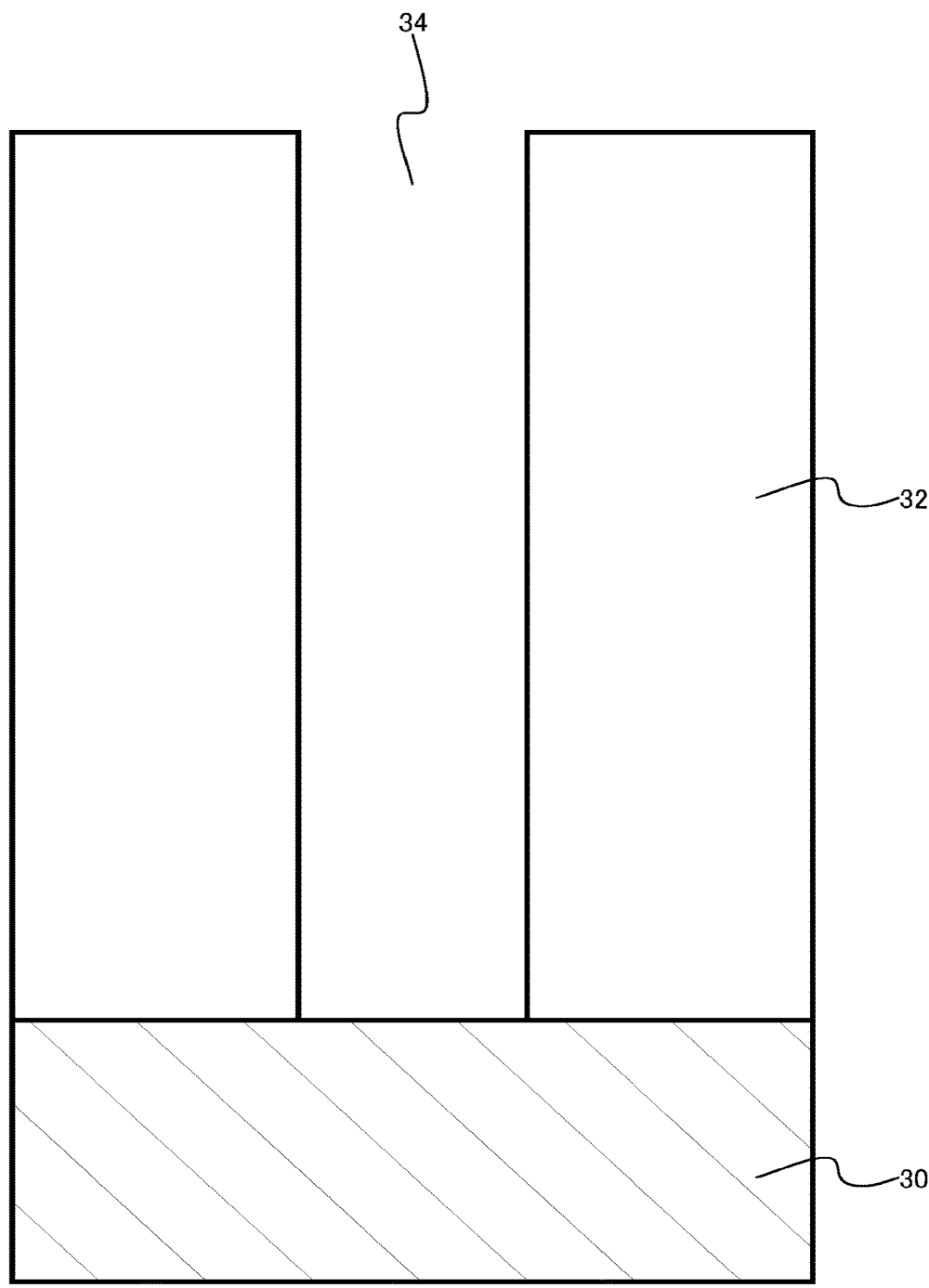
FIG. 4 is a schematic cross-sectional view illustrating a method for manufacturing the semiconductor device according to the first embodiment.

Then, an opening portion 34 reaching the silicon substrate 30 is formed in the silicon oxide layer 32 (FIG. 4). The opening portion 34 is also formed using, for example, a lithography method and a reactive ion etching method (RIE method).

Figure 5:
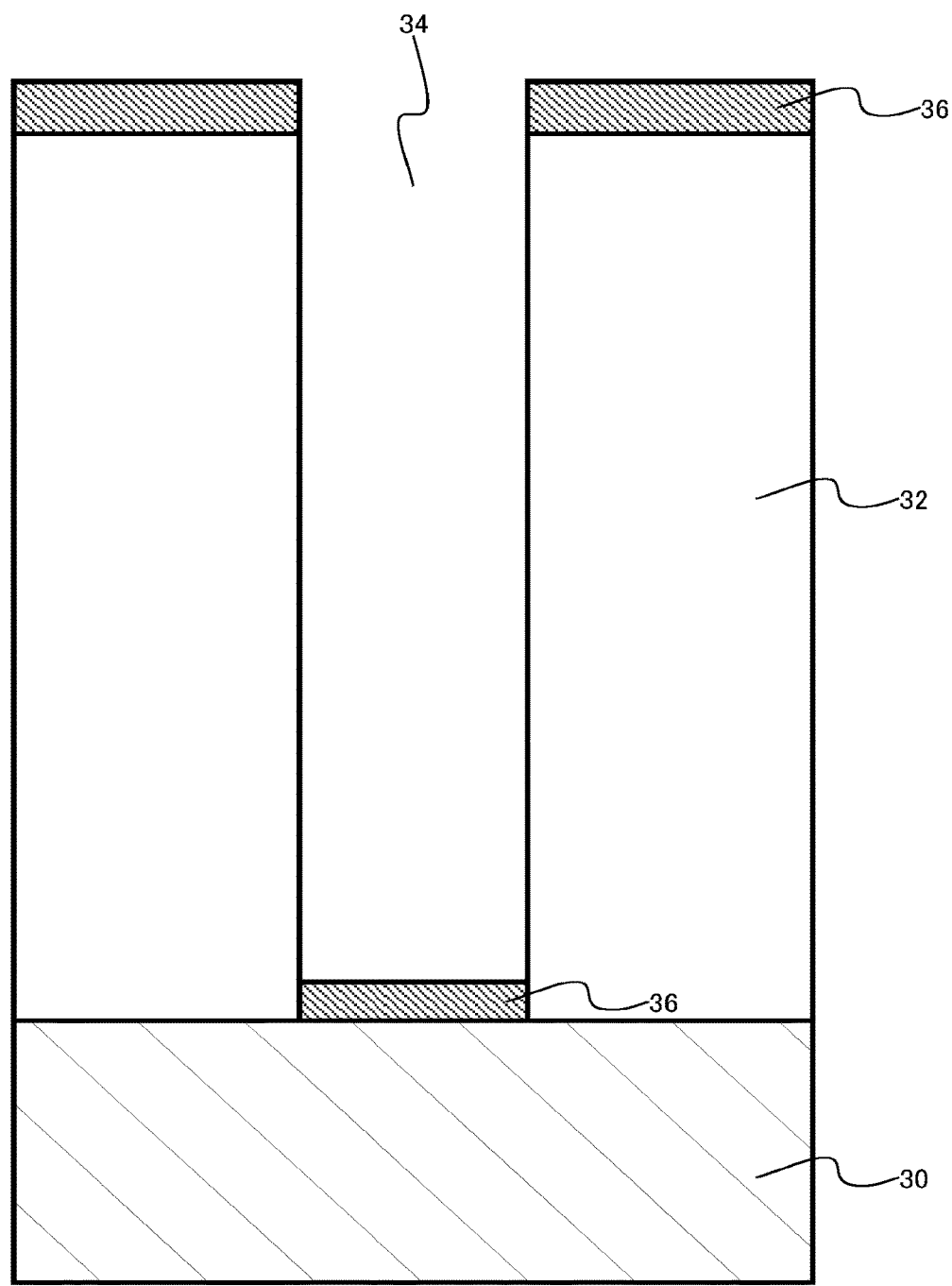
FIG. 5 is a schematic cross-sectional view illustrating a method for manufacturing the semiconductor device according to the first embodiment.

Then, a titanium film 36 is formed on the silicon substrate 30 exposed to a bottom portion of the opening portion 34 and on the silicon oxide layer 32 (FIG. 5). The titanium film 36 is an example of the first film. The titanium film 36 is formed using, for example, a plasma CVD method.

Figure 6:
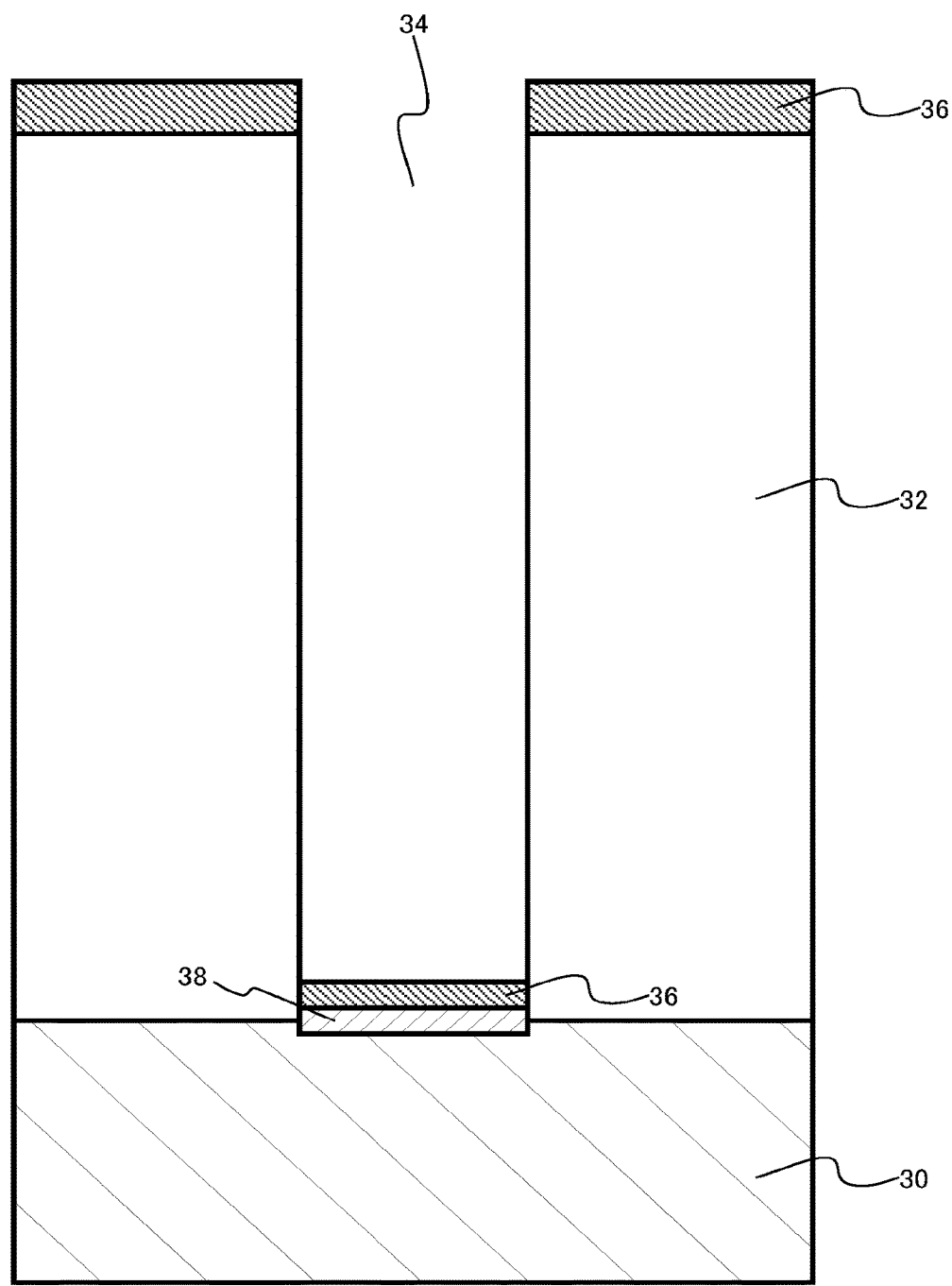
FIG. 6 is a schematic cross-sectional view illustrating a method for manufacturing the semiconductor device according to the first embodiment.

Then, the silicon substrate 30 and the titanium film 36 are made to react together to form a titanium silicide film 38 (FIG. 6). The titanium silicide film 38 is an example of the second film. The reaction between the silicon substrate 30 and the titanium film 36 occurs, for example, at the same time as the formation of the titanium film 36.

Figure 7:
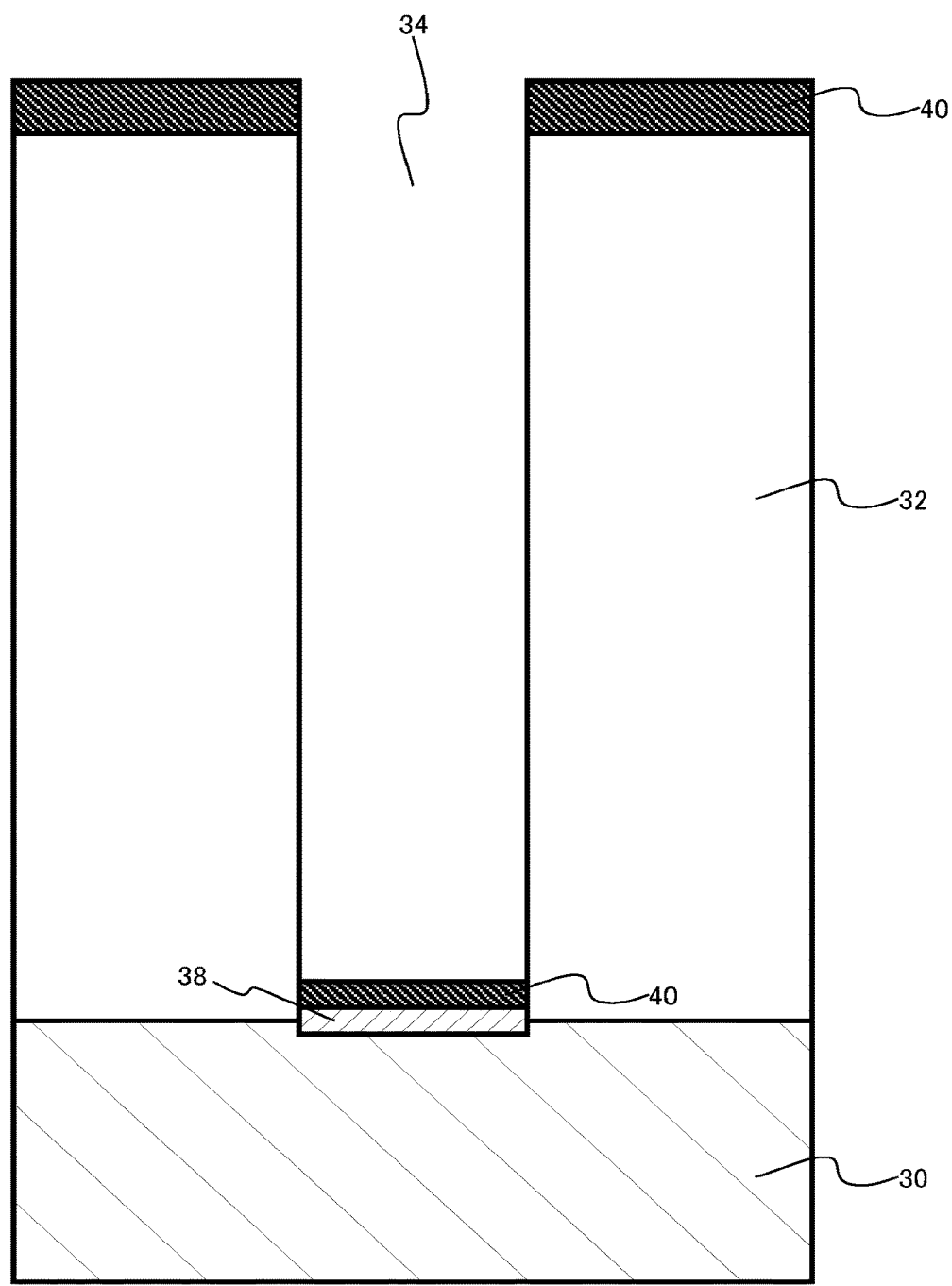
FIG. 7 is a schematic cross-sectional view illustrating a method for manufacturing the semiconductor device according to the first embodiment.

Then, the unreacted titanium film 36 is nitrided by heat treatment in an atmosphere including nitrogen, thereby forming a titanium nitride film 40 (FIG. 7). The titanium nitride film 40 is an example of the third film. The atmosphere including nitrogen is, for example, an atmosphere including ammonia gas.

Figure 8:
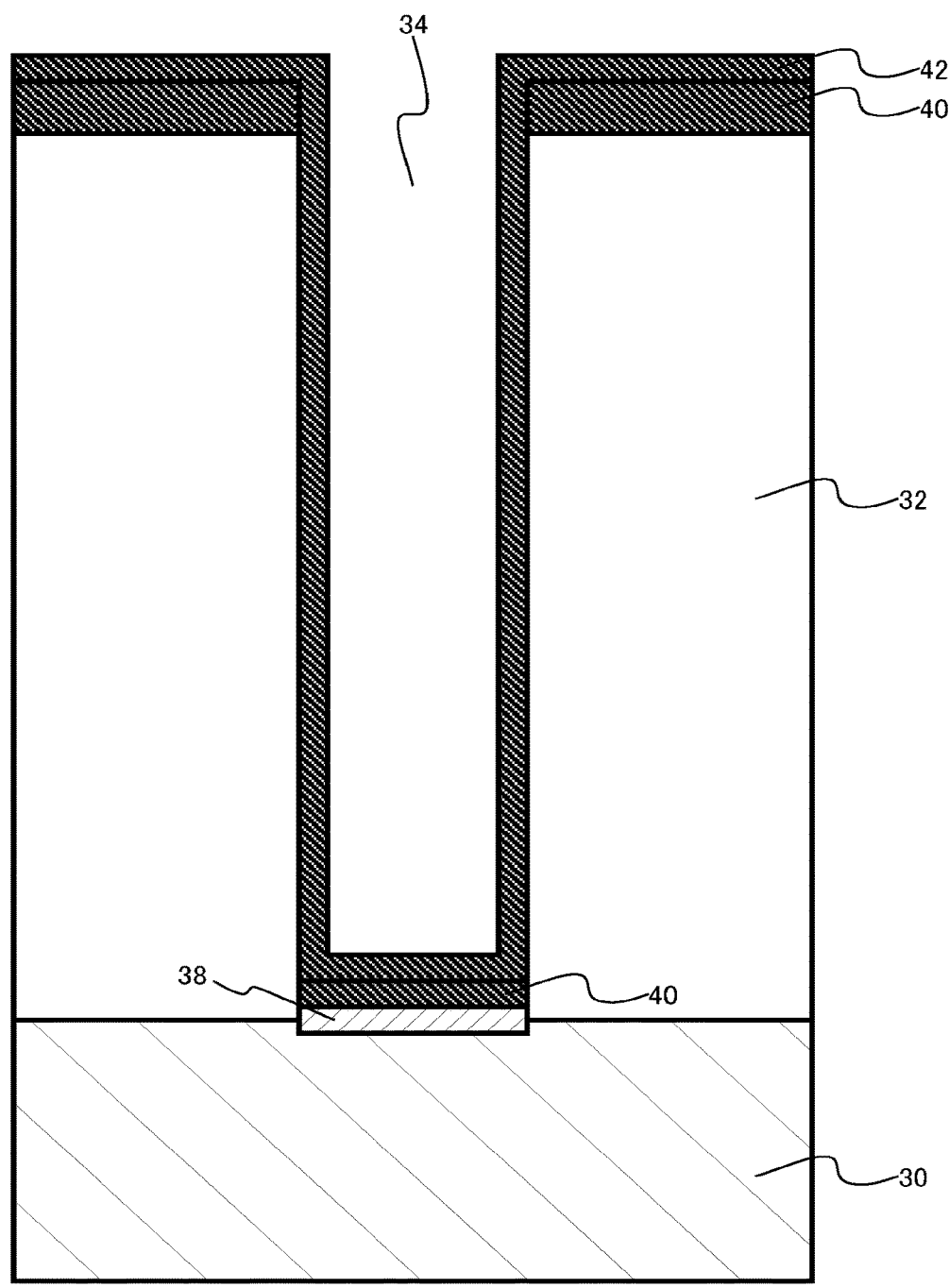
FIG. 8 is a schematic cross-sectional view illustrating a method for manufacturing the semiconductor device according to the first embodiment.

Then, a titanium nitride film 42 is formed in the opening portion 34 and on the silicon oxide layer 32 (FIG. 8). The titanium nitride film 42 is an example of the fourth film. The titanium nitride film 42 is formed using, for example, a thermal CVD method. Instead of the titanium nitride film 42, a titanium nitride film including silicon (Si) can be formed.

Figure 9:
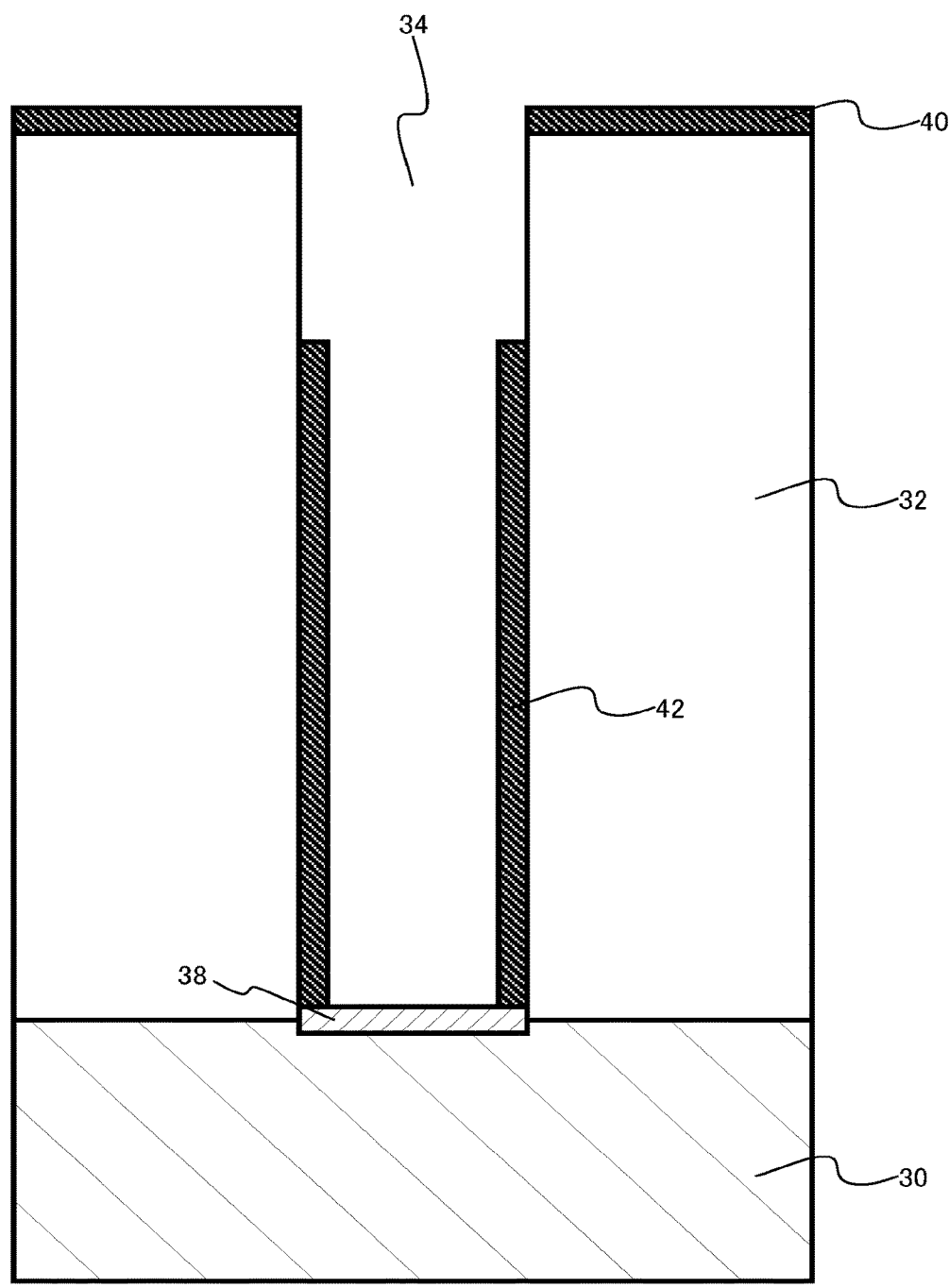
FIG. 9 is a schematic cross-sectional view illustrating a method for manufacturing the semiconductor device according to the first embodiment.

Then, the titanium nitride film 42 and the titanium nitride film 40 at the bottom portion of the opening portion 34 are removed. At the same time, the titanium nitride film 42 on the upper side surface of the opening portion 34 is removed (FIG. 9). The titanium silicide film 38 is exposed to the bottom portion of the opening portion 34. The titanium nitride film 42 on the silicon oxide layer 32 is removed, and at least a part of the titanium nitride film 40 remains. The titanium nitride film 42 on the lower side surface of the opening portion 34 remains.

The titanium nitride film 42 and the titanium nitride film 40 are removed by plasma treatment using tungsten chloride ($WCl_5$) as an etching gas. By using the plasma treatment, the titanium nitride film 40 on the silicon oxide layer 32 or the titanium nitride film 42 on the lower side surface of the opening portion 34 can be made to remain.

Figure 10:
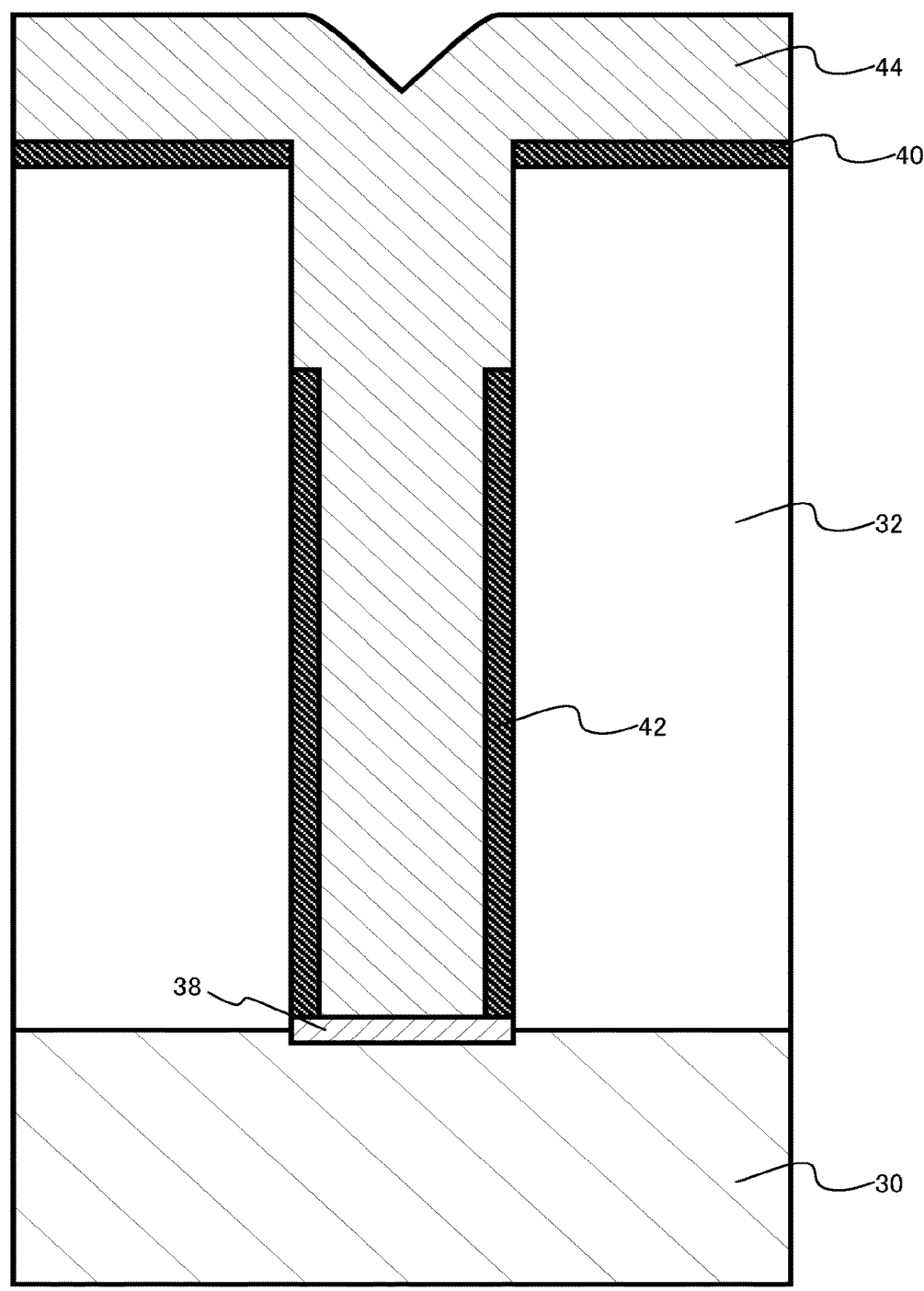
FIG. 10 is a schematic cross-sectional view illustrating a method for manufacturing the semiconductor device according to the first embodiment.

Then, the inside of the opening portion 34 is buried with a tungsten film 44 (FIG. 10). The tungsten film 44 is an example of the fifth film. The tungsten film 44 is formed using, for example, a thermal CVD method. The tungsten film 44 is formed using, for example, tungsten chloride ($WCl_5$) as a source gas. The removal of the titanium nitride film 42 and the formation of the tungsten film 44 are performed in the same process chamber, for example.

In addition, it is also possible to bury the opening portion 34 with the tungsten film 44 in two film forming steps. For example, by performing a first film forming step using tungsten chloride ($WCl_5$) as a source gas and then performing a second film forming step using tungsten fluoride ($WF_6$) as a source gas, the opening portion 34 can also be buried. The two film forming steps are performed in different process chambers, for example.

In addition, in order to bury the opening portion 34, it is possible to use a molybdenum film instead of the tungsten film 44. When a molybdenum film is used, for example, molybdenum chloride is used for the removal of the titanium nitride film 40 and the formation of the molybdenum film.

Figure 11:
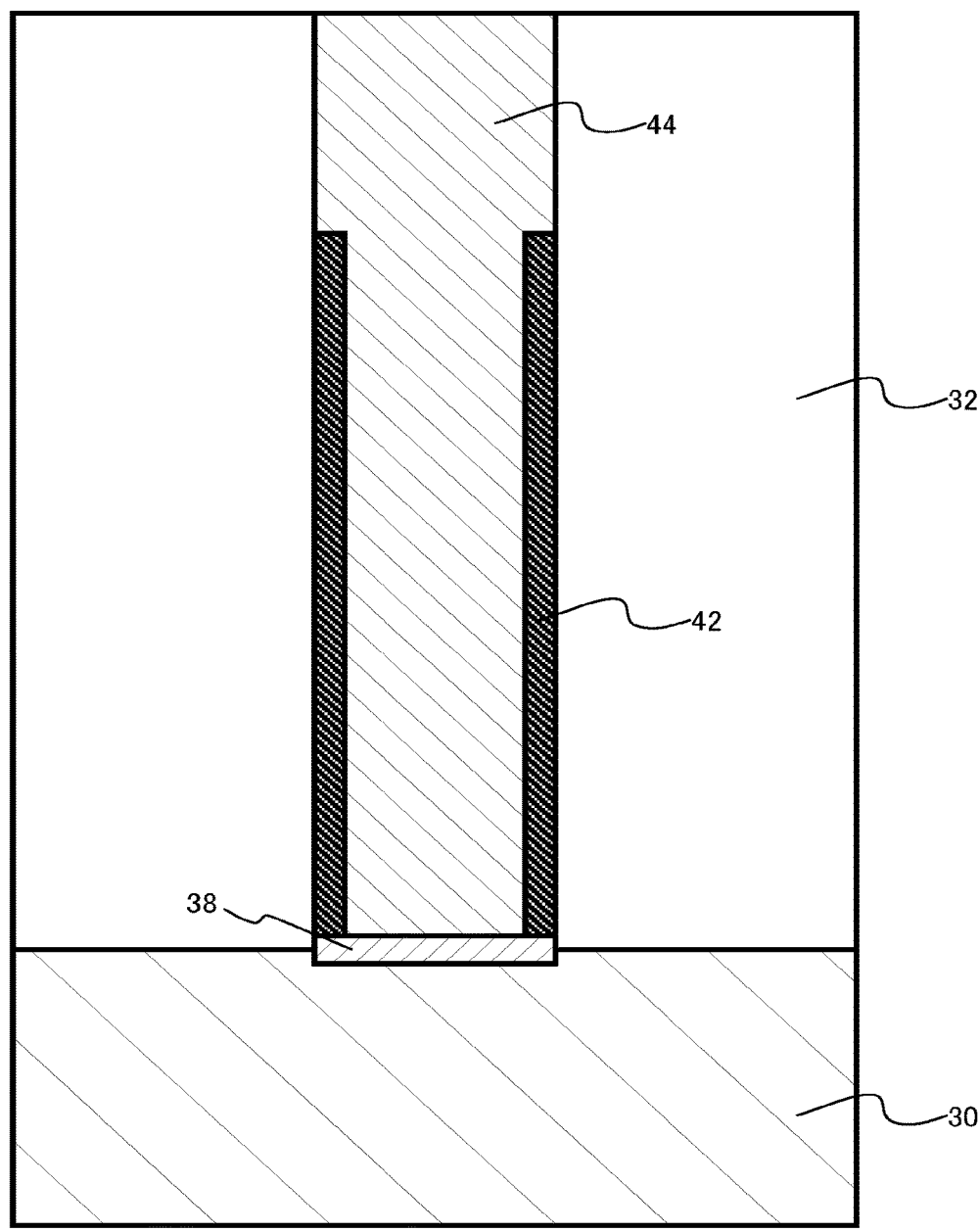
FIG. 11 is a schematic cross-sectional view illustrating a method for manufacturing the semiconductor device according to the first embodiment.

Then, the tungsten film 44 and the titanium nitride film 40 on the silicon oxide layer 32 are removed (FIG. 11). The tungsten film 44 and the titanium nitride film 40 are removed by using, for example, a chemical mechanical polishing method (CMP method).

Then, by forming the metal wiring 20 using a known process technique, a semiconductor device including the contact structure 100 illustrated in FIG. 1 is manufactured.

In addition, the silicon substrate 30 is the semiconductor substrate 10. In addition, the tungsten film 44 buried in the opening portion 34 is the contact plug 12. The titanium silicide film 38 is the silicide film 14. The titanium nitride film 42 remaining at the bottom portion of the side surface of the opening portion 34 is the sidewall film 16. The silicon oxide layer 32 is the insulating layer 18.

Next, the function and effect of the semiconductor device according to the first embodiment will be described.

Figure 12:
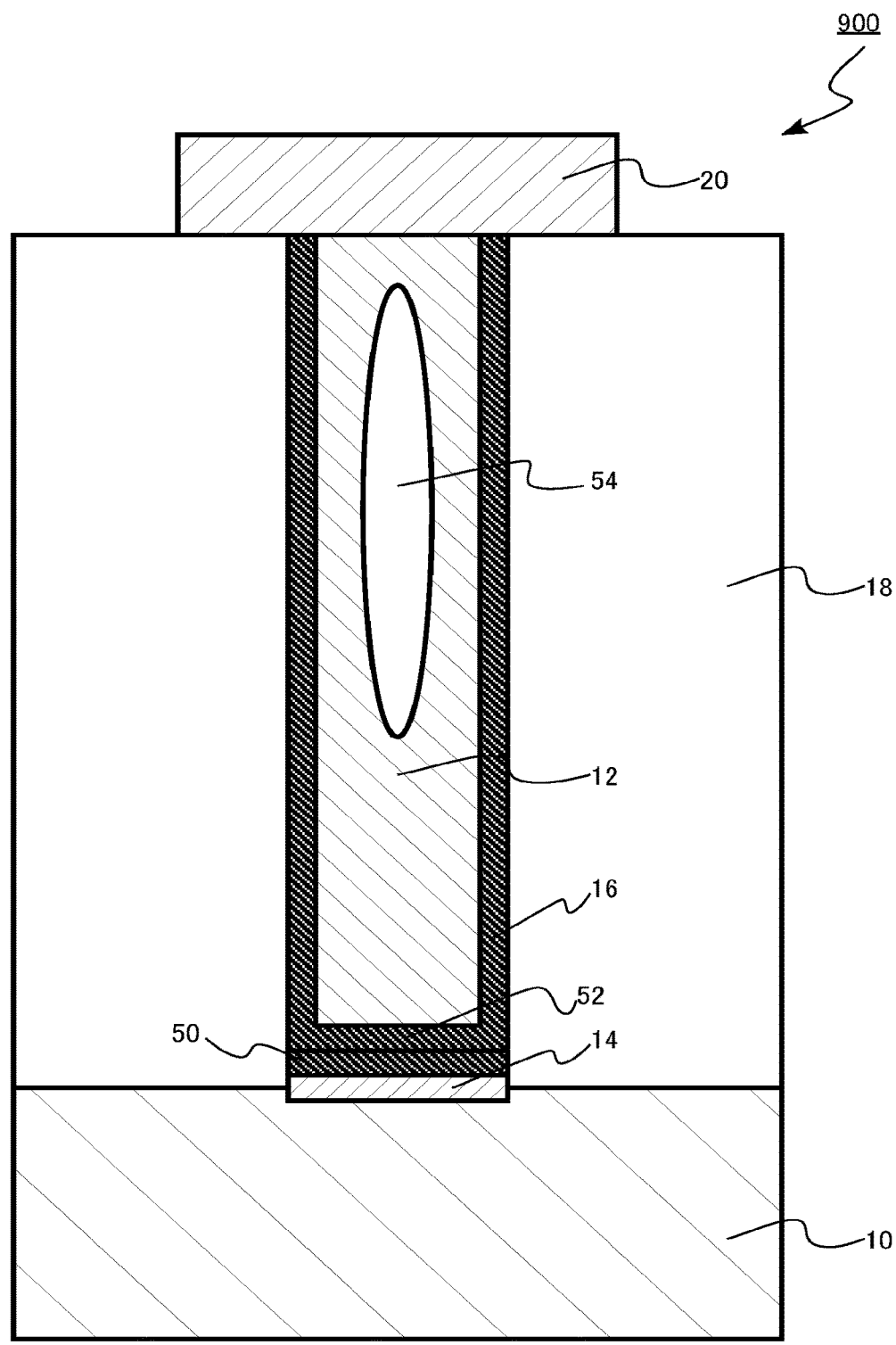
FIG. 12 is a schematic cross-sectional view of a semiconductor device of a comparative example.

FIG. 12 is a schematic cross-sectional view of a semiconductor device of a comparative example. FIG. 12 is a diagram corresponding to FIG. 1. The semiconductor device of the comparative example includes a contact structure 900.

The contact structure 900 is different from the contact structure 100 according to the first embodiment in that a titanium nitride film 50 and a film 52 including titanium (Ti) and nitrogen (N), which is continuous from the sidewall film 16, are present between the contact plug 12 and the semiconductor substrate 10. In addition, the contact structure 900 is different from the contact structure 100 according to the first embodiment in that a void 54 is present in the contact plug 12.

Figure 13:
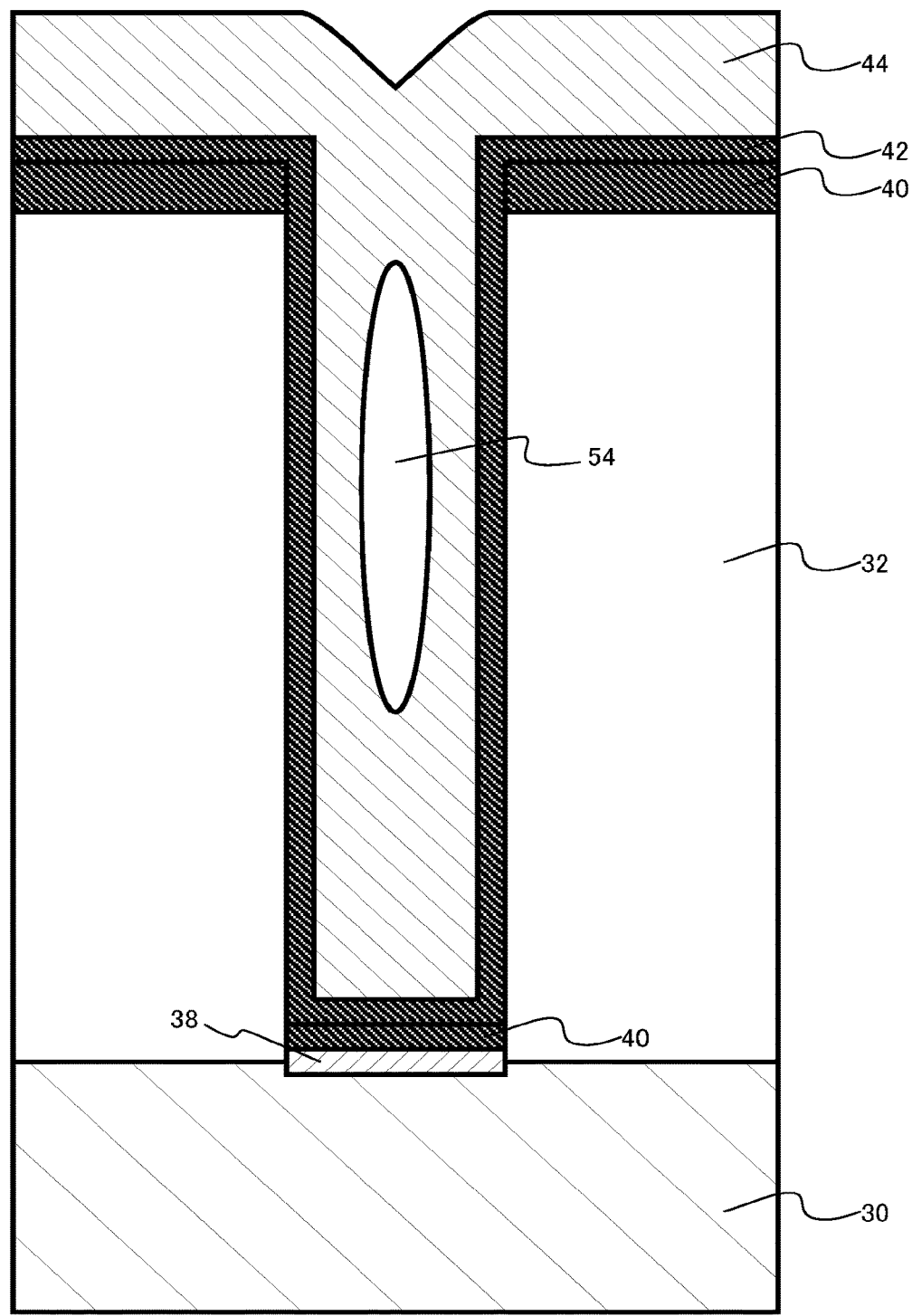
FIG. 13 is a schematic cross-sectional view illustrating a method for manufacturing the semiconductor device of the comparative example.

FIG. 13 is a schematic cross-sectional view illustrating a method for manufacturing the semiconductor device of the comparative example. FIG. 13 corresponds to FIG. 10 of the first embodiment. FIG. 13 illustrates a state in which the inside of the opening portion 34 is buried with the tungsten film 44.

The method for manufacturing the semiconductor device of the comparative example is different from the method for manufacturing the semiconductor device according to the first embodiment in that the titanium nitride film 42 and the titanium nitride film 40 are not removed before the tungsten film 44 is formed. Therefore, the titanium nitride film 40 at the bottom portion of the opening portion 34 finally remains as the titanium nitride film 50 illustrated in FIG. 12. In addition, the titanium nitride film 42 at the bottom portion of the opening portion 34 finally remains as the film 52 including titanium (Ti) and nitrogen (N) illustrated in FIG. 12.

The contact structure 900 of the comparative example has a problem that the contact resistance between the contact plug 12 and the semiconductor substrate 10 is high. It is thought that one of the reasons is that nitrogen is diffused into the silicide film 14 by the heat treatment of the process after forming the contact structure 900 from the titanium nitride film 42 and the film 52 including titanium (Ti) and nitrogen (N). It is thought that the diffused nitrogen reacts with titanium silicide in the silicide film 14 to form silicon nitride. Since the silicon nitride is an insulator, the contact resistance is high.

In addition, it is thought that another factor of increasing the contact resistance is that the barrier property of the silicide film 14 is lowered by the reaction between nitrogen and the titanium silicide in the silicide film 14. A void is generated in the semiconductor substrate 10 due to the suction of silicon to the contact plug 12. Since the void is an insulator, the contact resistance is high.

In addition, in the contact structure 900 of the comparative example, the void 54 is present in the contact plug 12. By providing the sidewall film 16 up to the upper side surface of the contact plug 12, the effective aspect ratio of the opening portion 34 when forming the tungsten film 44 is increased. Therefore, it is thought that the void 54 is formed because it is difficult to bury the opening portion 34 with the tungsten film 44. The presence of the void 54 increases the electrical resistance of the contact plug 12.

In the contact structure 900 of the comparative example, since the contact resistance between the contact plug 12 and the semiconductor substrate 10 is high and the electrical resistance of the contact plug 12 is high, the resistance of the contact structure is high.

In the contact structure 100 of the first embodiment, the nitrogen concentration between the contact plug 12 and the semiconductor substrate 10 is low. Alternatively, there is no film including nitrogen. Therefore, the diffused nitrogen does not react with the titanium silicide in the silicide film 14 to form silicon nitride. In addition, no void is formed in the semiconductor substrate 10. Therefore, an increase in contact resistance between the contact plug 12 and the semiconductor substrate 10 is suppressed.

In addition, in the contact structure 100 of the first embodiment, the sidewall film 16 is not provided between the upper side surface of the contact plug 12 and the insulating layer 18. Therefore, the effective aspect ratio of the opening portion 34 when forming the tungsten film 44 is reduced. Accordingly, since it becomes easy to bury the opening portion 34 with the tungsten film 44, the formation of the void 54 is suppressed. Therefore, an increase in the electrical resistance of the contact plug 12 is suppressed.

According to the contact structure 100 of the first embodiment, the resistance of the contact structure can be reduced.

From the viewpoint of suppressing the formation of the void 54 of the contact plug 12, the first distance d1 is preferably 90° or less, more preferably 80° or less, and even more preferably 70% or less of the second distance d2.

From the viewpoint of shortening the time to bury the opening portion 34 with the tungsten film 44, the first distance d1 is preferably 50% or more, and more preferably 60% or more of the second distance d2.

It is preferable that the removal of the titanium nitride film 42 and the formation of the tungsten film 44 are performed in the same process chamber. By performing the removal of the titanium nitride film 42 and the formation of the tungsten film 44 in the same process chamber, oxidation of the titanium silicide film 38 at the bottom portion of the opening portion 34 is suppressed. Therefore, an increase in contact resistance due to oxidation of the titanium silicide film 38 is suppressed.

The sidewall film 16 includes titanium (Ti) as a metal common to the silicide film 14. Therefore, the source gas for forming the sidewall film 16 and the silicide film 14 is common. Therefore, the productivity of the semiconductor device is improved.

As described above, according to the first embodiment, it is possible to provide a semiconductor device and a semiconductor device manufacturing method capable of reducing the resistance of the contact structure.

Second Embodiment

A semiconductor memory device according to a second embodiment includes: a semiconductor substrate; a conductor including tungsten (W) or molybdenum (Mo); a first film provided between the conductor and the semiconductor substrate and the first film including titanium (Ti) and silicon (Si); an insulating layer surrounding the conductor; a second film provided between the conductor and the insulating layer, the second film surrounding the conductor, and the second film including titanium (Ti) and nitrogen (N); a first metal wiring in contact with the conductor; a second metal wiring; and a memory cell array disposed between the semiconductor substrate and the second metal wiring. A first distance between the semiconductor substrate and an end portion of the second film on a side opposite to the semiconductor substrate is smaller than a second distance between the semiconductor substrate and an end portion of the conductor on a side opposite to the semiconductor substrate. A third distance between the semiconductor substrate and the second metal wiring is larger than a fourth distance between the semiconductor substrate and the first metal wiring. The semiconductor memory device according to the second embodiment includes a contact structure similar to that of the semiconductor device according to the first embodiment. Hereinafter, some descriptions of the content overlapping the first embodiment will be omitted.

Figure 14:
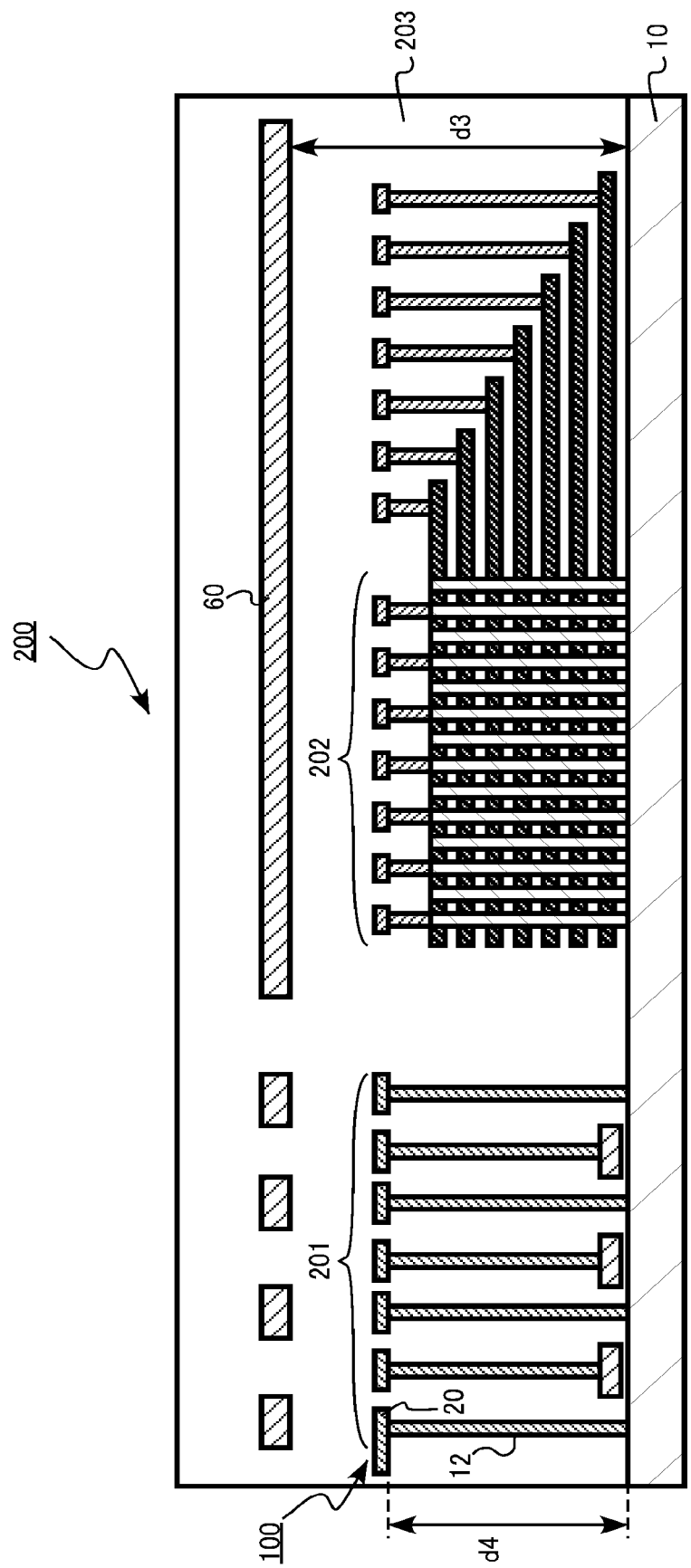
FIG. 14 is a schematic cross-sectional view of a semiconductor memory device according to a second embodiment.

FIG. 14 is a schematic cross-sectional view of the semiconductor memory device according to the second embodiment. The semiconductor memory device according to the second embodiment is a flash memory 200 including the contact structure 100 according to the first embodiment.

The flash memory 200 is a three-dimensional NAND flash memory in which memory cells are arranged in a three-dimensional manner.

The flash memory 200 includes a semiconductor substrate 10, a control circuit 201, a memory cell array 202, an interlayer insulating layer 203, and an upper metal wiring 60.

The control circuit 201 is provided on the semiconductor substrate 10. The control circuit 201 is formed in the interlayer insulating layer 203.

The control circuit 201 has a function of controlling the memory cell array 202. The control circuit 201 includes a plurality of semiconductor elements, such as transistors, and a wiring layer that electrically connects the semiconductor elements to each other. The contact structure 100 is provided in the control circuit 201.

As illustrated in FIG. 1, the contact structure 100 includes a semiconductor substrate 10, a contact plug 12, a silicide film 14, a sidewall film 16, an insulating layer 18, and a metal wiring 20. The contact plug 12 is an example of the conductor. The silicide film 14 is an example of the first film. The sidewall film 16 is an example of the second film. The metal wiring 20 is an example of the first metal wiring.

The memory cell array 202 is provided on the semiconductor substrate 10. The memory cell array 202 is formed in the interlayer insulating layer 203.

In the memory cell array 202, a plurality of memory cells are stacked in a three-dimensional manner. By arranging a plurality of memory cells in a three-dimensional manner, a large-capacity flash memory 200 can be realized.

The upper metal wiring 60 is provided on the memory cell array 202. The upper metal wiring 60 is an example of the second metal wiring. The memory cell array 202 is disposed between the semiconductor substrate 10 and the upper metal wiring 60. The upper metal wiring 60 is formed in the interlayer insulating layer 203.

The upper metal wiring 60 includes metal. The upper metal wiring 60 includes, for example, tungsten (W), copper (Cu), or aluminum (Al).

A third distance (d3 in FIG. 14) between the semiconductor substrate 10 and the upper metal wiring 60 is larger than a fourth distance (d4 in FIG. 14) between the semiconductor substrate 10 and the metal wiring 20.

The interlayer insulating layer 203 is provided on the semiconductor substrate 10. The interlayer insulating layer 203 has a function of electrically insulating the control circuit 201, the memory cell array 202, and the upper metal wiring 60 from each other.

The interlayer insulating layer 203 is an insulator. The interlayer insulating layer 203 includes, for example, silicon oxide, silicon oxynitride, or silicon nitride.

When forming the flash memory 200 according to the second embodiment, after forming the contact structure 100, a process for forming the upper metal wiring 60 is performed. Therefore, after forming the contact structure 100, heat treatment for forming the upper metal wiring 60 is applied.

In the contact structure 100, the nitrogen concentration between the contact plug 12 and the semiconductor substrate 10 is low. Alternatively, there is no film including nitrogen. Therefore, even if heat treatment is applied after the contact structure 100 is formed, the diffused nitrogen does not react with the titanium silicide in the silicide film 14 to form silicon nitride. In addition, no void is formed in the semiconductor substrate 10. Therefore, an increase in contact resistance between the contact plug 12 and the semiconductor substrate 10 is suppressed.

As described above, according to the second embodiment, it is possible to provide a semiconductor memory device capable of reducing the resistance of the contact structure.

Third Embodiment

A semiconductor memory device according to a third embodiment is different from the semiconductor memory device according to the second embodiment in that a conductor is disposed between a semiconductor substrate and a memory cell array. The semiconductor memory device according to the third embodiment includes a contact structure similar to that of the semiconductor device according to the first embodiment. Hereinafter, some descriptions of the content overlapping the first and second embodiments will be omitted.

Figure 15:
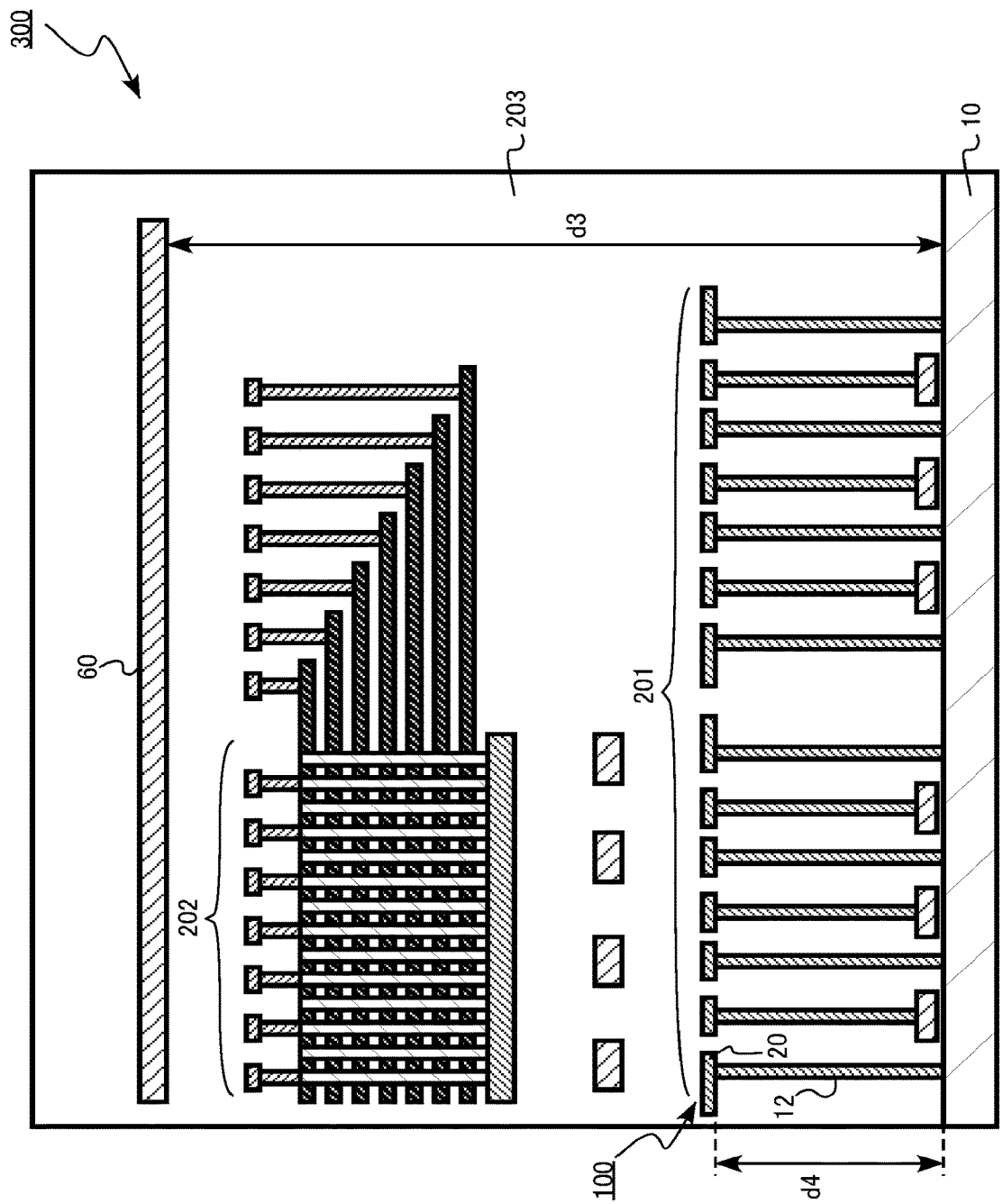
FIG. 15 is a schematic cross-sectional view of a semiconductor memory device according to a third embodiment.

FIG. 15 is a schematic cross-sectional view of the semiconductor memory device according to the third embodiment. The semiconductor memory device according to the third embodiment is a flash memory 300 including the contact structure 100 according to the first embodiment. The flash memory 300 is a three-dimensional NAND flash memory in which memory cells are arranged in a three-dimensional manner.

The flash memory 300 includes a semiconductor substrate 10, a control circuit 201, a memory cell array 202, an interlayer insulating layer 203, and an upper metal wiring 60.

The control circuit 201 is provided on the semiconductor substrate 10. The control circuit 201 is formed in the interlayer insulating layer 203.

The control circuit 201 has a function of controlling the memory cell array 202. The control circuit 201 includes a plurality of semiconductor elements, such as transistors, and a wiring layer that electrically connects the semiconductor elements to each other. The contact structure 100 is provided in the control circuit 201.

As illustrated in FIG. 1, the contact structure 100 includes a semiconductor substrate 10, a contact plug 12, a silicide film 14, a sidewall film 16, an insulating layer 18, and a metal wiring 20. The contact plug 12 is an example of the conductor. The silicide film 14 is an example of the first film. The sidewall film 16 is an example of the second film. The metal wiring 20 is an example of the first metal wiring.

The memory cell array 202 is provided on the semiconductor substrate 10. The memory cell array 202 is provided on the control circuit 201. The memory cell array 202 is formed in the interlayer insulating layer 203.

The contact structure 100 is provided between the semiconductor substrate 10 and the memory cell array 202.

In the memory cell array 202, a plurality of memory cells are stacked in a three-dimensional manner. By arranging a plurality of memory cells in a three-dimensional manner, a large-capacity flash memory 300 can be realized.

The upper metal wiring 60 is provided on the memory cell array 202. The upper metal wiring 60 is an example of the second metal wiring. The memory cell array 202 is disposed between the semiconductor substrate 10 and the upper metal wiring 60. The upper metal wiring 60 is formed in the interlayer insulating layer 203.

The upper metal wiring 60 includes metal. The upper metal wiring 60 includes, for example, tungsten (W), copper (Cu), or aluminum (Al).

A third distance (d3 in FIG. 15) between the semiconductor substrate 10 and the upper metal wiring 60 is larger than a fourth distance (d4 in FIG. 15) between the semiconductor substrate 10 and the metal wiring 20.

The interlayer insulating layer 203 is provided on the semiconductor substrate 10. The interlayer insulating layer 203 has a function of electrically insulating the control circuit 201, the memory cell array 202, and the upper metal wiring 60 from each other.

The interlayer insulating layer 203 is an insulator. The interlayer insulating layer 203 includes, for example, silicon oxide, silicon oxynitride, or silicon nitride.

When forming the flash memory 300 according to the third embodiment, after forming the contact structure 100, a process for forming the memory cell array 202 and the upper metal wiring 60 is performed. Therefore, after forming the contact structure 100, heat treatment for forming the memory cell array 202 and the upper metal wiring 60 is applied.

In the contact structure 100, the nitrogen concentration between the contact plug 12 and the semiconductor substrate 10 is low. Alternatively, there is no film including nitrogen. Therefore, even if heat treatment is applied after the contact structure 100 is formed, the diffused nitrogen does not react with the titanium silicide in the silicide film 14 to form silicon nitride. In addition, no void is formed in the semiconductor substrate 10. Therefore, an increase in contact resistance between the contact plug 12 and the semiconductor substrate 10 is suppressed.

As described above, according to the third embodiment, it is possible to provide a semiconductor memory device capable of reducing the resistance of the contact structure.

In the second and third embodiments, the case where the semiconductor memory device is a three-dimensional NAND flash memory has been described as an example. However, the semiconductor memory device is not limited to the three-dimensional NAND flash memory. The semiconductor memory device may be another semiconductor memory device, such as a dynamic random access memory (DRAM).

While certain embodiments have been described, these embodiments have been presented by way of example only, and are not intended to limit the scope of the inventions.

Indeed, the semiconductor device, the semiconductor memory device, and the semiconductor device manufacturing method described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device, comprising:
a semiconductor substrate including silicon (Si);
a conductor including tungsten (W) or molybdenum (Mo);
a first film provided between the conductor and the semiconductor substrate, and the first film including titanium (Ti) and silicon (Si);
an insulating layer surrounding the conductor; and
a second film provided between the conductor and the insulating layer, the second film surrounding the conductor, and the second film including titanium (Ti) and nitrogen (N),
wherein a first distance between the semiconductor substrate and an end portion of the second film on a side opposite to the semiconductor substrate is smaller than a second distance between the semiconductor substrate and an end portion of the conductor on a side opposite to the semiconductor substrate, and the conductor is in direct contact with the first film.

2. The semiconductor device according to claim 1, wherein the conductor is in contact with the insulating layer.

3. The semiconductor device according to claim 1, wherein the second film is spaced apart from the semiconductor substrate.

4. The semiconductor device according to claim 1, wherein the second film includes silicon (Si).

5. The semiconductor device according to claim 1, wherein the semiconductor substrate is a silicon substrate.

6. The semiconductor device according to claim 1, wherein a ratio of the second distance to a width of the conductor in a direction parallel to a surface of the semiconductor substrate is 5 or more.

7. The semiconductor memory device according to claim 1, wherein a nitrogen concentration between the conductor and the semiconductor substrate is lower than a nitrogen concentration between the conductor and the insulating layer.

8. A semiconductor memory device, comprising:
a semiconductor substrate including silicon (Si);
a conductor including tungsten (W) or molybdenum (Mo);
a first film provided between the conductor and the semiconductor substrate, and the first film including titanium (Ti) and silicon (Si);
an insulating layer surrounding the conductor;
a second film provided between the conductor and the insulating layer, the second film surrounding the conductor, and the second film including titanium (Ti) and nitrogen (N);
a first metal wiring in contact with the conductor;
a second metal wiring; and
a memory cell array disposed between the semiconductor substrate and the second metal wiring,
wherein a first distance between the semiconductor substrate and an end portion of the second film on a side opposite to the semiconductor substrate is smaller than a second distance between the semiconductor substrate and an end portion of the conductor on a side opposite to the semiconductor substrate, and
a third distance between the semiconductor substrate and the second metal wiring is larger than a fourth distance between the semiconductor substrate and the first metal wiring.

9. The semiconductor memory device according to claim 8, wherein the conductor is disposed between the semiconductor substrate and the memory cell array.

10. The semiconductor memory device according to claim 8, wherein the conductor is in direct contact with the first film.

11. The semiconductor memory device according to claim 8, wherein the conductor is in contact with the insulating layer.

12. The semiconductor memory device according to claim 8, wherein the second film is spaced apart from the semiconductor substrate.

13. The semiconductor memory device according to claim 8, wherein the second film includes silicon (Si).

14. The semiconductor memory device according to claim 8, wherein the semiconductor substrate is a silicon substrate.

15. The semiconductor memory device according to claim 8, wherein a nitrogen concentration between the conductor and the semiconductor substrate is lower than a nitrogen concentration between the conductor and the insulating layer.

* * * * *